United States Patent [19]

Murakami

[11] Patent Number: 5,252,135
[45] Date of Patent: Oct. 12, 1993

[54] SEALING APPARATUS FOR CONTINUOUS VACUUM TREATING EQUIPMENT

[75] Inventor: Koji Murakami, Osaka, Japan

[73] Assignee: Chugai Ro Co., Ltd., Osaka, Japan

[21] Appl. No.: 907,111

[22] Filed: Jul. 1, 1992

[30] Foreign Application Priority Data

Jul. 2, 1991 [JP] Japan .................. 3-161598

[51] Int. Cl.$^5$ .................................. C23C 14/56
[52] U.S. Cl. .......................... 118/733; 118/50; 118/50.1
[58] Field of Search ............ 118/733, 50, 50.1

[56] References Cited

FOREIGN PATENT DOCUMENTS 1932796 6/1968 Fed. Rep. of Germany .
1163311 9/1958 France .
63-24067 2/1988 Japan .

OTHER PUBLICATIONS

Patent Abstracts of Japan, vol. 12, No. 230 (C—508)(3077) Jun. 29, 1988 & JP-A-63 026 365 (Nippon Kokan KK) Feb. 3, 1988.

Primary Examiner—Richard Bueker

[57] ABSTRACT

An intermediate roll is immersed in the sealing liquid accumulated in the U-shaped sealing tank. First reversing rolls and second reversing rolls are located above the vacuum end of the tank and third reversing rolls and fourth reversing rolls are located above the open end of the tank. Two endless belts extend from the first roll to the second roll, and extend from the second roll to the third roll via the intermediate roll, and extended from the third roll to the fourth roll, and are return to the first roll via the intermediate roll. The endless belts have means for separably joining both the side edges of one endless belt to that of the other. A steel strip is inserted into the gap between the endless belts at any one pair of reversing rolls located in an upstream side, and is released from any one pair of reversing rolls located in a down stream side.

8 Claims, 5 Drawing Sheets

SEALING APPARATUS FOR CONTINUOUS VACUUM TREATING EQUIPMENT

BACKGROUND OF THE INVENTION

1. Field of the Invention

The present invention relates to a sealing apparatus for a continuous vacuum treating equipment.

2. Description of the Background Art

In a continuous vacuum treating equipment of a steel strip, a sealing apparatus is installed in a charge opening and a discharge opening of the vacuum treating chamber for isolating the inside of the vacuum treating chamber from the atmospheric air.

It has previously been proposed to provide various types of the sealing apparatus, for example a belt-sealing type as disclosed in Japanese Patent Laid-open Publication No. 63-24067.

In this conventional belt-sealing type of the sealing apparatus, there always exist the clearance between the treating material and the belt, and between the belt and the housing. Therefore, it has not been possible to prevent the atmospheric air from infiltrating into the vacuum treating chamber. Further, the sealing apparatus has been structurally complicate and expensive.

SUMMARY OF THE INVENTION

The present invention has been developed to substantially eliminate the above-described disadvantages.

The object of the present invention is therefore to provide a sealing apparatus for a continuous vacuum treating equipment which is structurally simple and is capable of almost completely preventing the atmospheric air from infiltrating into the vacuum treating chamber.

In order to achieve the aforementioned objective, the sealing apparatus according to the present invention is installed in the charge opening and the discharge opening of the continuous vacuum treating equipment, and includes the following:

a substantially U-shaped sealing tank in which a sealing liquid consisting of liquid metal is accumulated, the one end of the sealing tank communicating with the vacuum and the other end of the sealing tank opening to the atmospheric air;

an intermediate roll immersed in the sealing liquid;

two pairs of first reversing rolls and second reversing rolls being located above the vacuum end of the sealing tank and being arranged in the lateral direction and inclined at 45 degrees so that upper ends thereof are disposed adjacent to each other;

two pairs of third reversing rolls and fourth reversing rolls being located above the open end of the sealing tank and being arranged and inclined in the same manner as the first reversing rolls and the second reversing rolls; and two endless belts, which are of liquid repellant material, having means for separably joining both the side edges of the one endless belt to those of the other, said each endless belt being extended from a first reversing roll to a second reversing roll; and extended from a second reversing roll to a third reversing roll via one end of the intermediate roll, and extended from a third reversing roll to a fourth reversing roll, and returned to the first reversing roll via the other end of the intermediate roll, so that each endless belt comes into contact with each other in the sealing liquid, whereby a strip material is inserted into the gap between the endless belts at any one pair of the reversing rolls located in the upstream side of the sealing tank, and is released from any one pair of the reversing rolls located in the down stream side of the sealing tank.

According to the present invention the charge and discharge opening of the vacuum treating chamber are perfectly sealed by the sealing liquid accumulated in the sealing tank. Further, the steel strip is conveyed without being contaminated by the sealing liquid, since the steel strip passes through the sealing liquid in the condition of being enclosed and sealed between two liquid-repellent endless belts. Furthermore, the sealing device certainly prevents the atmospheric air from penetrating into the vacuum treating chamber.

BRIEF DESCRIPTION OF THE DRAWINGS

This and other objects and features of the present invention will become clear from the following description taken in conjunction with the preferred embodiments thereof with reference to the accompanying drawings, throughout which like parts are designated by like reference numerals, and in which.

DETAILED DESCRIPTION OF THE PREFERRED EMBODIMENTS

Figure 1:
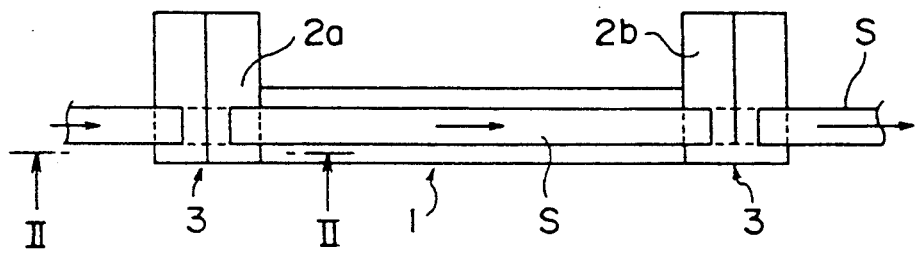
FIG. 1 is a schematic plan view of the first embodiment of the continuous vacuum treating equipment provided with the sealing apparatus according to the present invention.

FIGS. 1–6 show the first embodiment of the invention. Referring now to FIG. 1, there is shown a continuous vacuum treating equipment (hereinafter referred to simply as "vacuum treating chamber") 1, for example, a continuous vacuum depositing equipment for a steel strip, having a charge opening 2a and a discharge opening 2b. A sealing apparatus 3 is installed in the charge opening 2a and the discharge opening 2b.

The sealing apparatus 3 comprises mainly a substantially U-shaped sealing tank 4 in which the sealing liquid W is accumulated, a driving intermediate roll 5 immersed in the sealing liquid W, a pair of the first reversing rolls 6a, 6b, a pair of the second reversing rolls 6a', 6b', a pair of the third reversing rolls 7a', 7b', a pair of fourth reversing rolls 7a, 7b, two endless belts 8 having the separably joining means 9 at both the side edges, and two fastening members 10 for fastening both the side edges of the endless belts 8.

The sealing tank 4 has substantially U-shaped configuration. The one end of the sealing tank 4 communicates with the vacuum at the charge opening 2a of the vacuum treating chamber 1 and the other end of the sealing tank 4 opens to the atmospheric air. In the sealing tank 4, the sealing liquid W is accumulated. The sealing liquid W consists of a liquid metal or alloy of a lower melting point than 100° C. and of a high specific gravity, for example, a mercury or Wood's metal.

Figure 3:
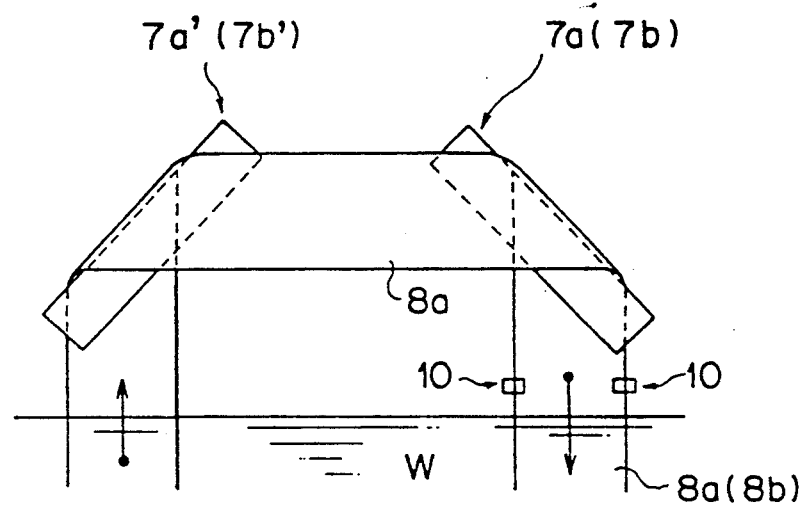
FIG. 3 is a view in the direction of the arrow X in FIG. 2.
Figure 4:
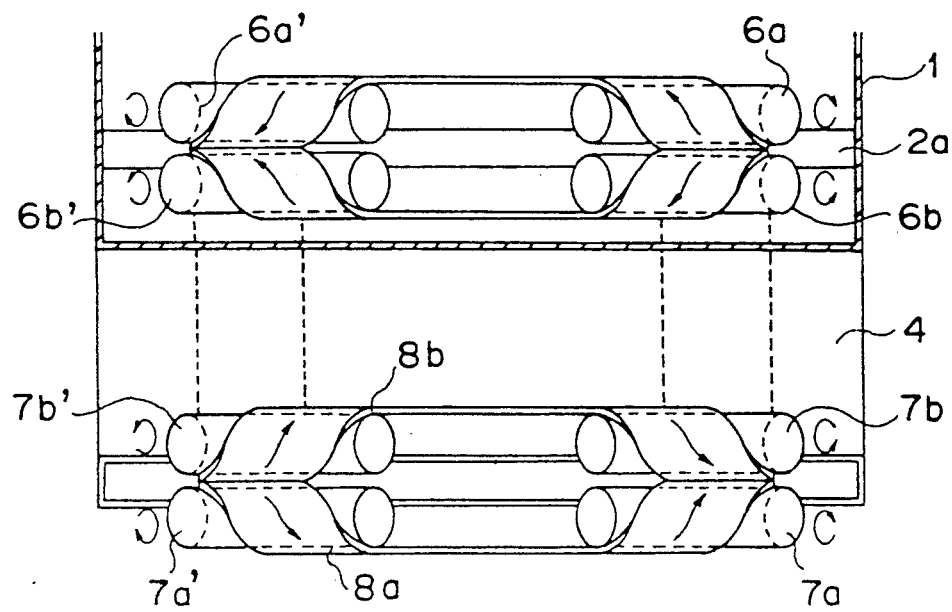
FIG. 4 is a plan view of the sealing apparatus shown in FIG. 2.

The first reversing rolls 6a, 6b and the second reversing rolls 6a', 6b, are located above the charge opening 2a of the vacuum treating chamber 1. The first reversing rolls 6a, 6b are, as indicated in FIG. 4, parallel and adjacent to each other with predetermined gap in the longitudinal direction of the vacuum treating chamber. The second reversing rolls 6a', 6b' are parallel and adjacent to each other similarly to the pair of rolls 6a, 6b. The first reversing rolls 6a, 6b and the second reversing rolls 6a', 6b' are arranged in the lateral direction of the vacuum treating chamber 1 and are inclined at 45 degrees so that those upper ends come close to each other as indicated in FIG. 3. The third reversing rolls 7a', 7b' and the fourth reversing rolls 7a, 7b are located above the open end of the sealing tank 4 and arranged and inclined in the same manner as that of the first and the second reversing rolls 6a, 6b; 6a', 6b'.

The endless belt 8 comprise two endless belts 8a, 8b and are of liquid-repellent and elastic material such as fluororesin. Both the side edges of each endless belts 8a, 8b have thinner thickness than the central portion. The longitudinally elongated projection 9a, which is rounded at the free end, is formed near the one side edge of each endless belts 8a, 8b. The longitudinally elongated recess 9b is formed near the other side edge of each endless belts 8a, 8b. The longitudinally elongated projection 9a of the endless belts 8a and the longitudinally elongated recess 9b of the endless belts 8b constitute the separably joining means 9. Each endless belts 8a, 8b may be of uniform thickness.

The endless belt 8a is extended from the first reversing roll 6a to the second reversing roll 6a', and extended from the second reversing roll 6a' to the third reversing roll 7a' via the one end of the driving intermediate roll 5, and extended from the third reversing roll 7a' to the fourth reversing roll 7a, and returned to the first reversing roll 6a via the other end of the driving intermediate roll 5. Similarly, the endless belt 8b extends from the first reversing roll 6b to the second reversing roll 6b', and extends from the second reversing roll 6b' to the third reversing roll 7b' via the one end of the driving intermediate roll 5, and extends from the third reversing roll 7b' to the fourth reversing roll 7b, and is then returned to the first reversing roll 6b via the other end of the driving intermediate roll 5. Whereby, the longitudinally elongated projection 9a of the one endless belt is opposed to the longitudinally elongated recess 9b of the other endless belt in the sealing liquid W of the sealing tank 4.

Figure 6:
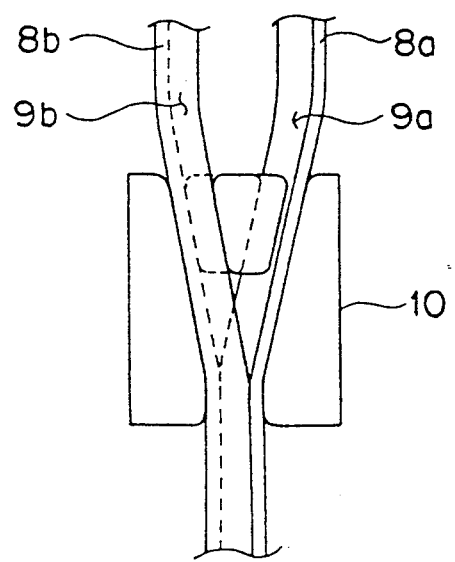
FIG. 6 is a side view of the variant form of the fastening means.

The fastening members 10 in this preferred embodiment comprise two pair of the roll fasteners which fasten both of the side edges of the endless belts 8a, 8b so that the longitudinally elongated projection 9a may engage to the longitudinally elongated recess 9b. These two pair of roll fasteners are located at the upstream side of the sealing tank 4 i.e. between the second reversing rolls 6a', 6b' and the sealing liquid W, and between the fourth reversing rolls 7a, 7b and the sealing liquid W. Alternatively, the fastening members 10 may be a slide fastener, as shown in FIG. 6, which guide the longitudinally elongated projection 9a and the longitudinally elongated recess 9b to come close to each other and fit there together.

Although the outside configuration of the sealing tank 4 is of substantially U-shape in this embodiment, the inside of the sealing tank 4 may be substantially U-shaped construction and a plurality of intermediate rolls may be installed in the sealing tank 4.

While above mentioned sealing apparatus 3 is installed in the charge opening 2a of the vacuum treating chamber 1, the sealing apparatus 3 of similar construction is also installed in the discharge opening 2b.

The sealing apparatus 3 described above is operated as follows.

First of all, the sealing liquid W is poured into the sealing tank 4, whereby the charge opening 2a and the discharge opening 2b of the vacuum treating chamber 1 are isolated from the atmospheric air. Then the inside of the vacuum treating chamber 1 is held at a predetermined degree of vacuum. When the driving roll 5 rotates and the endless belts 8a, 8b move, at the upstream side of the sealing tank 4 the longitudinally elongated projections 9a are engaged with the longitudinally elongated recess 9b by the roll fasteners 10 and both side edges of the endless belt 8a are joined to the opposite side edges of the endless belt 8b, while at the down stream side of the sealing tank 4 i.e. at the first and the third reversing rolls 6a, 6b; 7a', 7b' the longitudinally elongated projections 9a are disengaged from the longitudinally elongated recesses 9b and both side edges of the endless belt 8a are released from the opposite side of the endless belt 8b.

And when the steel strip S is inserted into the gap between the endless belts 8a, 8b at the fourth reversing rolls 7a, 7b, the steel strip S, in the condition of being enclosed and sealed between the endless belts 8a, 8b, is conveyed from the position of the fourth reversing rolls 7a, 7b to the position of the first reversing rolls 6a, 6b in accordance with the movement of the endless belts 8a, 8b.

The sealing condition of the steel strip S is farther maintained in the sealing liquid W, since the hydraulic pressure of the sealing liquid W is acted on the outer surfaces of the endless belts 8a, 8b in which the steel strip S is enclosed.

The steel strip S enclosed in the endless belts 8a, 8b is released from the first reversing rolls 6a, 6b located above the charge opening 2a and is conveyed toward the discharge opening 2b. The vacuum deposition is carried out while the steel strip S passes through the vacuum treating chamber 1. And then the steel strip S is conveyed outside of the vacuum treating chamber 1 through the sealing device 3 installed in the discharge opening 2b.

Figure 2:
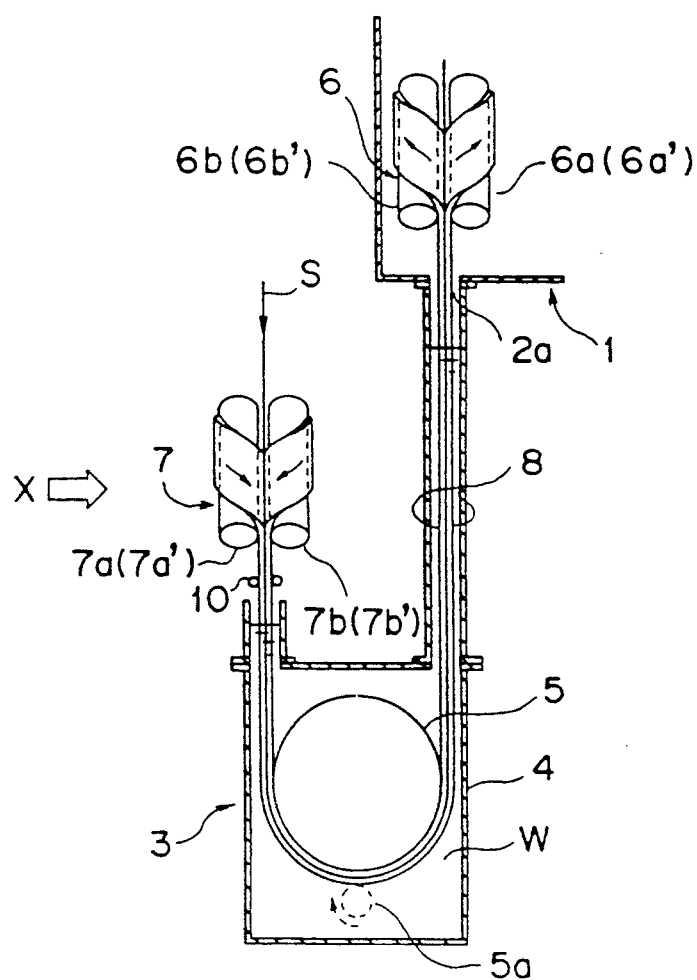
FIG. 2 is a sectional detail view of the sealing apparatus installed in the charge opening shown in FIG. 1 taken along a line II—II.
Figure 7:
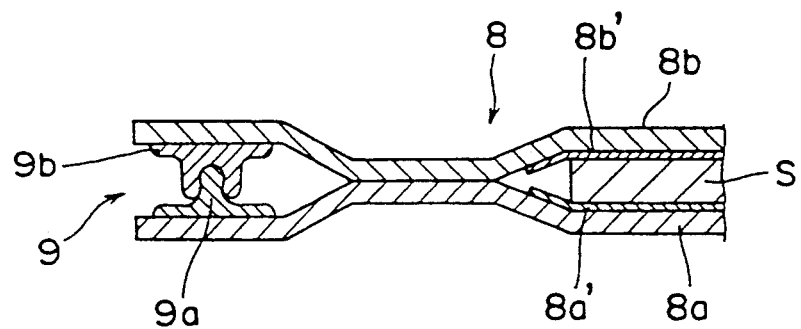
FIG. 7 is a enlarged sectional view of the modification of the separably joining means.

In this embodiment, although the separably joining means 9 formed on the endless belts 8 consist of the longitudinally elongated projection 9a and the longitudinally elongated recess 9b which is engaged with the longitudinally elongated projection 9a, it may be an adhesive or an adhesive tape which is not contaminated by the sealing liquid W and is possible to glue the endless belts 8a, 8b repeatedly. Further, the separably joining means 9 which are replaceable as shown in FIG. 7 may be glued to the side edges of the endless belts 8a, 8b, and the belt members 8a', 8b' which are also replaceable may be glued to the central portion of the endless belts 8a, 8b so that the steel strip S may be contacted therewith. Furthermore, the endless belt 8 may be driven by the driving roll 5a which presses the intermediate roll 5 via the endless belt 8 as shown in FIG. 2.

Figure 5:
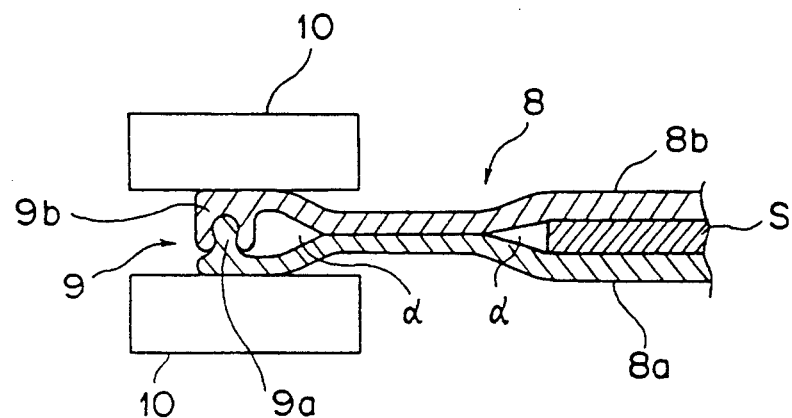
FIG. 5 is a enlarged sectional view of the separably joining means.

When the steel strip S is enclosed and sealed into the gap between the endless belts 8a, 8b, there exists the clearance $\alpha$, as indicated in FIG. 5, between the sealing portion of the endless belts 8a, 8b and the steel strip S, and air is included in the clearance $\alpha$. However it is negligible that the atmospheric air infiltrates into the vacuum treating chamber 1 via this clearance $\alpha$, since the clearance $\alpha$ is extremely minute and long.

In the case that the sealing liquid W adheres to the separably joining means 9, above the roll fasteners 10 the cleaner means (not shown) which remove the sealing liquid W adhering to the separably joining means 9, and means for controlling the position of the endless belts 8a, 8b may be provided so that the side edges of the endless belts 8a, 8b may be accurately joined to each other by the separably joining means 9.

Figure 8:
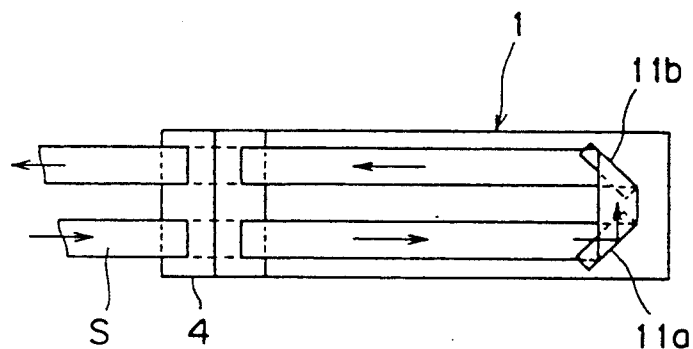
FIG. 8 is a schematic plan view of the second embodiment of the continuous vacuum treating equipment provided with the sealing apparatus according to the present invention.

In this embodiment, although the sealing apparatus 3 is applied to the vacuum treating chamber 1 of which the charge opening 2a and the discharge opening 2b are located in both the ends and in which the steel strips S is conveyed along the straight line, it may be applied to the vacuum treating chamber 1, as shown in FIG. 8, of which the charge and discharge opening are located in one end and in which the steel strip S is conveyed along the U-shaped line through the return rolls 11a, 11b. In this case, both the charge and discharge openings are sealed by one sealing apparatus 3 and the length of the vacuum treating chamber I is reduced.

Although the present invention has been fully described by way of the examples with reference to the accompanying drawing, it is to be noted here that various changes and modifications will be apparent to those skilled in the art. Therefore, unless such changes and modifications otherwise depart from the spirit and scope of the present invention, they should be construed as being included therein.

What is claimed is:

1. A sealing apparatus installed in a charge opening and a discharge opening of a continuous vacuum treating equipment, comprising:
   a substantially U-shaped sealing tank in which a sealing liquid consisting of liquid metal is accumulated, the one end of said sealing tank communicating with the vacuum and the other end of said sealing tank opening to the atmospheric air;
   an intermediate roll immersed in said sealing liquid;
   two pairs of first reversing rolls and second reversing rolls being located above the vacuum end of said sealing tank and being arranged in the lateral direction and inclined at 45 degrees so that upper ends thereof are disposed adjacent to each other;
   two pairs of third reversing rolls and fourth reversing rolls being located above the open end of said sealing tank and being arranged and inclined in the same manner as said first reversing rolls and said second reversing rolls; and
   two endless belts, which are of liquid repellent material, having means for separably joining both the side edges of said one endless belt to those of the other, said each endless belt being extended from said first reversing rolls to said second reversing rolls, and extended from said second reversing rolls to said third reversing rolls via one end of said intermediate roll, and extended from said third reversing rolls to said fourth reversing rolls, and returned to said first reversing rolls via the other end of said intermediate roll, so that said each endless belt comes into contact with each other in said sealing liquid, whereby a strip material is inserted into the gap between said endless belts at any one pair of said reversing rolls located in the upstream side of said sealing tank, and is released from any one pair of said reversing rolls located in the down stream side of said sealing tank.

2. The sealing apparatus according to claim 1, further comprising means for fastening both the side edges of said endless belts so that said separable joining means may join both the side edges of said one endless belt to those of the other, said fastening means being located at the upstream side of said sealing tank.

3. The sealing apparatus according to claim 2, wherein said fastening means is a pair of roll fastener.

4. The sealing apparatus according to claim 2, wherein said fastening means is a slide fastener.

5. The sealing apparatus according to any one of preceding claims, wherein said separable joining means comprises:
   a longitudinally elongated projection, which is rounded at the free end, formed near one side edge of said each endless belt; and
   a longitudinally elongated recess, which is engaged with said longitudinally elongated projection, formed near the other side edge of each endless belt.

6. The sealing apparatus according to claim 5, wherein said longitudinally elongated projection and recess are glued to the side edges of said endless belts so as to be replaceable.

7. The sealing apparatus according to any one of claims 1–4, wherein said separable joining means comprises an adhesive which is not contaminated by said sealing liquid for gluing said endless belt repeatedly.

8. The sealing apparatus according to any one of claims 1–4, wherein said endless belts have a belt member which is replaceable, said belt member being glued to the central portion of said each endless belt so that the strip material may be in contact therewith.

* * * * *